(12) United States Patent
Kikuchi

(10) Patent No.: US 6,573,594 B2
(45) Date of Patent: Jun. 3, 2003

(54) BGA SEMICONDUCTOR DEVICE USING INSULATING FILM

(75) Inventor: Noriaki Kikuchi, Yukuhashi (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/925,092

(22) Filed: Aug. 8, 2001

(65) Prior Publication Data

US 2002/0079565 A1 Jun. 27, 2002

(30) Foreign Application Priority Data

Aug. 8, 2000 (JP) ........................................ 2000-239657

(51) Int. Cl.$^7$ .............................................. H01L 23/04
(52) U.S. Cl. ........................ 257/698; 257/784; 257/701
(58) Field of Search .................. 257/698, 701, 257/784

(56) References Cited

U.S. PATENT DOCUMENTS 5,710,071 A * 1/1998 Beddingfield et al.
5,841,192 A * 11/1998 Exposito
6,283,846 B1 * 5/2002 Shen et al.

* cited by examiner

*Primary Examiner*—Sheila V. Clark
(74) *Attorney, Agent, or Firm*—Jordan and Hamburg LLP

(57) ABSTRACT

A BGA semiconductor device using an insulating film and having air purge holes situated between metal through-holes in a base film serving as a substrate Stagnant air can be purged from voids formed between the insulating film arranged on the upper face of a wiring pattern on the base film and the wiring pattern via the air purge holes before electronic elements formed with chip bonding are packaged with asealing resin.

18 Claims, 2 Drawing Sheets

BGA SEMICONDUCTOR DEVICE USING INSULATING FILM

FIELD OF THE INVENTION

The present invention relates to a BGA semiconductor device having an insulating film.

BACKGROUND OF THE INVENTION

Conventional technology involves using an insulating film for a BGA semiconductor device. In particular, a commonly used substrate is a base film in which through-holes are made, wiring is printed on the upper face thereof, the insulating film is set on the printed wiring, and a chip is placed on the upper face of the insulating film to provide for gold-streak bonding between the chip and the wiring. These electronic elements are packaged with a resin. Solder balls are welded to the through-holes at the reverse side of the base film. A BGA semiconductor device is manufactured in this manner.

Unfortunately, when the wiring is printed on the base film and the insulating film is further set on the upper face thereof, an unevenness is formed on the insulating film in conjunction with the printing of the wiring pattern, creating gaps between wires and between the wiring and the insulating film covering the upper face thereof. Air is present in these gaps. If the electronic elements are packaged with the resin under such circumstances, air in the gaps expands whereby portions of the base film are blistered to give height inequality to the lower end faces of a number of solder balls welded to the reverse side of the base film. Using the BGA semiconductor device in such conditions precludes the accurate connection of another terminal to the solder balls located at the reverse side of the BGA semiconductor device and the satisfactory functioning of a semiconductor.

OBJECT AND SUMMARY OF THE INVENTION

It is an object of the present invention to provide a BGA semiconductor device which overcomes the defects mentioned above.

In order to achieve this object, in one embodiment of the present invention, a BGA semiconductor device comprises an insulating film and a base film having metal through-holes and air purge holes formed between the metal through-holes. Air is purged from gaps between the base film and the insulating film via the air purge holes.

In another embodiment of the present invention, a wiring pattern is printed on the upper face of the base film in which the metal through-holes are made, the insulating film is set on the wiring pattern, a chip is placed on the upper face of the insulating film to provide for gold-streak bonding between the chip and the wiring, and these electronic elements are packaged with a resin, while solder balls are welded to the through-holes at the reverse side of the base film. In accordance with the invention, air purge holes are made between the metal through-holes in the base film so that air staying in recessed portions formed between the insulating film set on the upper face of the wiring pattern and the wiring pattern is purged via the purge holes.

According to the present invention, the purge holes located between through-holes are independently made during the formation of the base film, the wiring pattern is printed on the base film, and the insulating film is further set on the upper face thereof.

In this manner, air purge via the purge holes is carried out such that stagnant air is purged from voids formed between each wire-to-wire recessed portion of the wiring pattern and the insulating film set on the upper face thereof until the voids between the base film and the insulating film are cleared out.

If these electronic elements are molded and packaged with the resin under such circumstances, stagnant air completely disappears in the hardened resin. This eliminates the possibility of expansion of air in the molded resin due to heat during molding or heat generated around the BGA semiconductor device, when used.

Therefore, non-continuity with connection terminals during use of the BGA semiconductor device, due to the non-uniform terminal faces of the solder balls welded to the through-holes in the base film, is prevented.

DETAILED DESCRIPTION OF THE PREFERRED EMBODIMENTS

Figure 1:
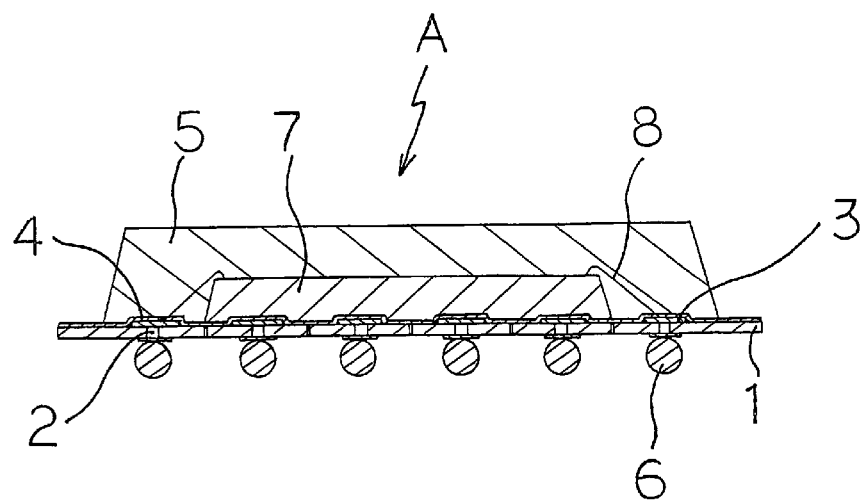
FIG. 1 is a sectional view of a BGA semiconductor device using an insulating film in accordance with the invention.
Figure 2:
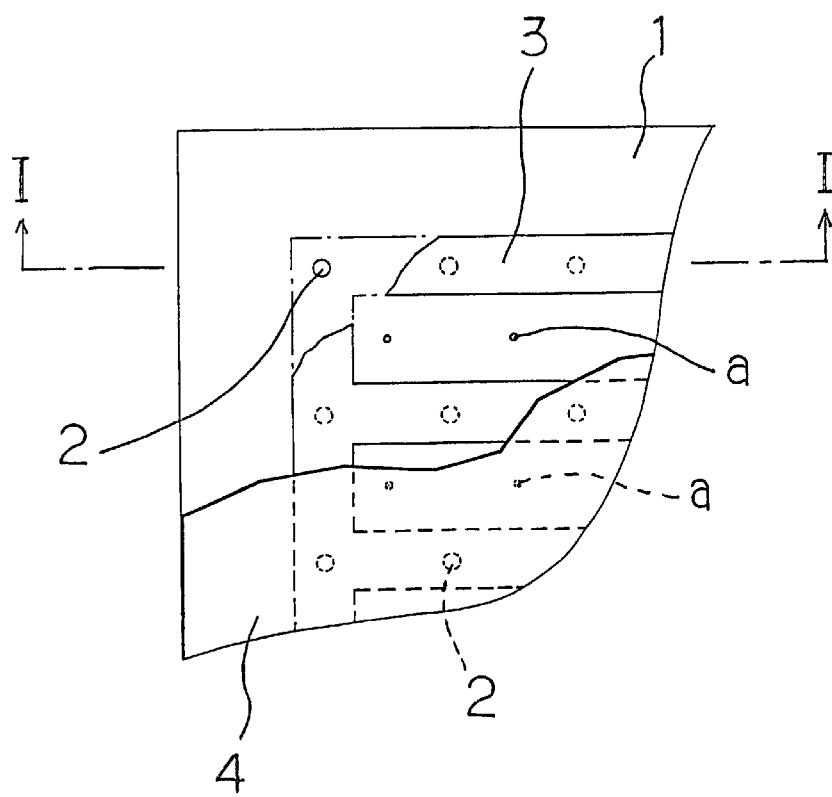
FIG. 2 is a plan view of a base film used for the BGA semiconductor device using the insulating film in accordance with the invention.

Referring to the drawings, FIG. 1 shows a sectional view of a BGA semiconductor device A in accordance with the present invention, wherein a base film 1 as a substrate contains a number of through-holes 2 to which terminals comprised of solder balls 6 are welded. The upper face of the base film 1 is provided with a printed wiring pattern 3 and the upper face of the wiring pattern 3 is provided with a set insulating film 4 of polyimide. The upper face of the insulating film 4 is bonding-covered with a chip 7.

Figure 3:
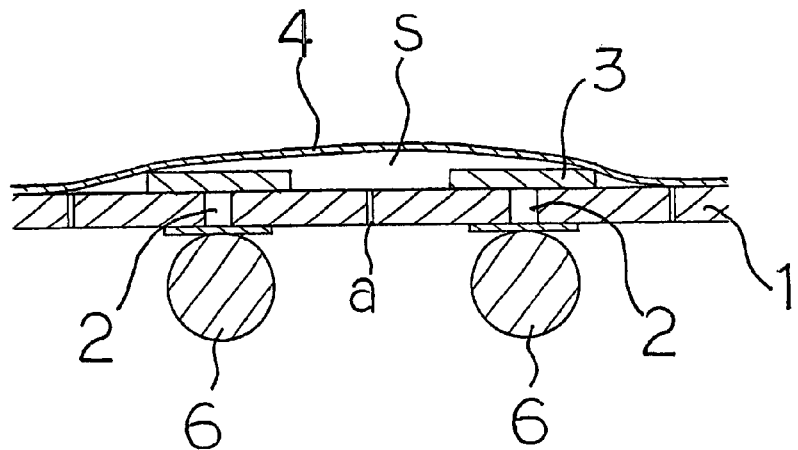
FIG. 3 is an enlarged sectional view along a line I—I shown in FIG. 2.
Figure 4:
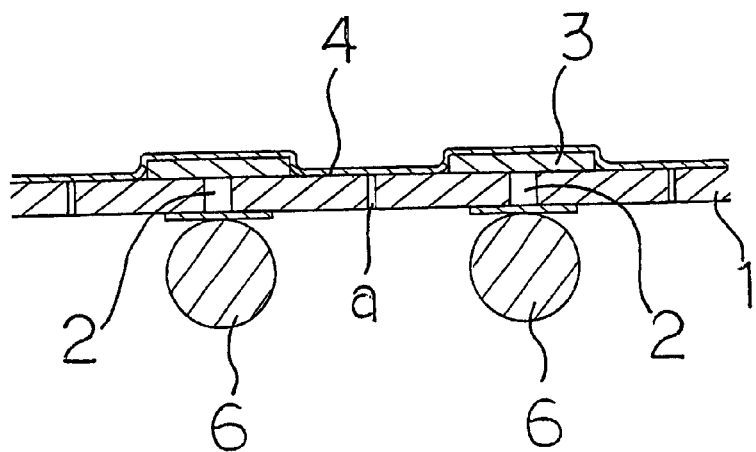
FIG. 4 is a sectional view showing the condition of air purge in FIG. 3

Further, purge holes (a) are made between through-holes 2 in the base film 1, as shown in an enlarged sectional view of FIG. 3, and the purge holes (a) are in communication with voids (s) formed between the base film 1 and the insulating film 4.

Since recessed portions spaced from each other a predetermined distance are formed between wires of the wiring pattern 3 printed on the upper face of the base film 1, the voids (s) are formed between each wire-to-wire recessed portion of the wiring pattern 3 and the insulating film 4 covering the upper face thereof. The voids (s) formed between each wire-to-wire recessed portion of the wiring pattern 3 and the insulating film 4 covering the upper face thereof result in the presence of stagnant air.

With the purge of the stagnant air from the voids (s) formed by the wire-to-wire recessed portions via the purge holes (a) opening in the base film 1 by using a vacuum, the voids (s) formed between each wire-to-wire recessed portion and the insulating film 4 are cleared out to eliminate the stagnant air.

In these circumstances, bonding of a chip and molding and packaging of the electronic elements with a resin 5 are carried out.

Then, the solder balls 6 are transferred via a flux to the through-holes 2 at the reverse side of the base film 1 and welded to the through-holes 2 in a reflow process.

The processes of manufacturing the BGA semiconductor device in accordance with the present invention, which is constructed in the above-described manner, are described below, including the purge of stagnant air between the wiring pattern 3 and the insulating film 4.

First, the purge holes (a) are made between the through-holes 2 in concurrence with the formation of the through-holes 2 in the process of producing the base film 1.

The purge holes (a), each of which has a diameter equal to or smaller than the diameter of each through-hole 2, are located nearly midway between the through-holes 2.

Thus, the through-holes 2 are positioned to have continuity with the printed wires when the wiring pattern 3 is printed in the following process, the voids (s) requiring air purge are formed between the through-holes 2 in coating the upper face thereof with the insulating film 4 and the purge holes (a) communicate with the voids (s).

The purge holes (a), if located midway between the printed wires, communicate with the voids (s) to be formed by the insulating film 4 in the following process.

When the insulating film 4 of polyimide is set on the upper face of the wiring pattern 3, the voids (s) are formed between each wire-to-wire recessed portion of the wiring pattern 3 and the insulating film 4. The voids (s) are arranged to open to the atmosphere in communication with the purge holes (a) formed between the through-holes 2.

To achieve air purge from the voids (s), the electronic elements including the base film 1, the wiring pattern 3 and the insulating film 4 set on the upper face thereof are stored in a vacuum chamber and the vacuum chamber is evacuated by using a vacuum. The result is that air is purged from the voids (s) via the purge holes (a).

Complete air purge brings the insulating film 4 in close contact with the wire-to-wire recessed portions of the wiring pattern 3 and eliminates the possibility of air reentering into the recessed portions because of complete disappearance of the voids (s).

It is acceptable to provide means for blocking the purge holes (a) after the air purge, for example, means for applying a blocking paint to the opening ends of the purge holes (a), if necessary.

After the air purge, the chip 7 is placed on the electronic elements for bonding of gold streaks 8 between the chip 7 and the wiring pattern 3 in a chip bonding process. Then, the electronic elements are molded and packaged with the resin 5.

The solder balls 6 are put in the through-holes 2 at the reverse side of the base film 1 and welded thereto in the reflow process. The BGA semiconductor device A manufactured in this manner is formed without any air in the package, therefore eliminating the possibility of expansion of air in the semiconductor device due to heat.

This prevents the warping of the base film due to heat generated in the reflow process or during using the semiconductor and gives height equality to the lower end faces of the plurality of solder balls to ensure connection between each solder ball and another terminal during use of the semiconductor. Additionally, there is no cracking to the package due to thermal expansion of air.

In accordance with the present invention, the purge holes are made between the base film and the through-holes so that air in the recessed portions formed between the insulating film set on the upper face of the wiring pattern and the wiring pattern is purged via the purge holes, therefore eliminating stagnant air between the base film and the insulating film and preventing poor continuity between terminals during use of the semiconductor as a result of thermal expansion of air during molding the electronic elements with the resin which causes the base film to be blistered to give height inequality to the lower end faces of the solder balls.

What is claimed is:

1. A BGA semiconductor device, comprising:

a base film;

a wiring pattern arranged on an upper face of said base film; and an insulating film covering said wiring pattern and said base film, said base film including metal through-holes leading to said wiring pattern and air purge holes arranged between said metal through-holes and leading to parts of the upper face of said base film uncovered by said wiring pattern and covered by said insulating film, said air purge holes opening on both sides of said base film to thereby enable air between said base film and said insulating film to be purged therefrom.

2. A BGA semiconductor device, comprising:

a base film including metal through-holes;

a wiring pattern printed on an upper face of said base film;

an insulating film set on said wiring pattern;

a chip arranged on an upper face of said insulating film to provide for gold-streak bonding between said chip and said wiring pattern;

a resin arranged over said chip;

solder balls welded to said metal through-holes at a lower face of said base film, said base film comprising air purge holes arranged between said metal through-holes in said base film to enable air in recessed portions formed between said insulating film and said base film to be purged.

3. The BGA semiconductor device of claim 1, further comprising a chip arranged on an upper face of said insulating film.

4. The BGA semiconductor device of claim 3, further comprising a resin arranged over said chip.

5. The BGA semiconductor device of claim 1, further comprising solder balls fixed to a lower face of said base film in connection with said metal through-holes.

6. The BGA semiconductor device of claim 1, further comprising solder balls welded to a lower face of said base film in connection with said metal through-holes.

7. The BGA semiconductor device of claim 1, wherein said insulating film is polyimide.

8. The BGA semiconductor device of claim 1, wherein voids are formed between each wire-to-wire recessed portion of said wiring pattern and said insulating film when said wiring pattern is covered by said insulating film, at least one of said air purge holes being in communication with each of said voids.

9. The BGA semiconductor device of claim 1, wherein said air purge holes have a diameter equal to a diameter of said metal-through-holes.

10. The BGA semiconductor device of claim 1, wherein said air purge holes have a diameter smaller than a diameter of said metal-through-holes.

11. The BGA semiconductor device of claim 1, wherein said air purge holes are arranged midway between wires of said wiring pattern.

12. The BGA semiconductor device of claim 1, wherein said air purge holes are arranged substantially midway between said metal through-holes.

13. The BGA semiconductor device of claim 2, wherein said insulating film is polyimide.

14. The BGA semiconductor device of claim 2, wherein voids are formed between each wire-to-wire recessed portion of said wiring pattern and said insulating film when said wiring pattern is covered by said insulating film, at least one of said air purge holes being in communication with each of said voids.

15. The BGA semiconductor device of claim 2, wherein said air purge holes have a diameter equal to a diameter of said metal-through-holes.

16. The BGA semiconductor device of claim 2, wherein said air purge holes have a diameter smaller than a diameter of said metal-through-holes.

17. The BGA semiconductor device of claim 2, wherein said air purge holes are arranged midway between wires of said wiring pattern.

18. The BGA semiconductor device of claim 2, wherein said air purge holes are arranged substantially midway between said metal through-holes.

* * * * *